(12) United States Patent
Ugajin et al.

(10) Patent No.: US 8,956,546 B2
(45) Date of Patent: Feb. 17, 2015

(54) SUBSTRATE PROCESSING METHOD AND SUBSTRATE PROCESSING APPARATUS

(75) Inventors: Hajime Ugajin, Yamanashi (JP); Shigeki Tozawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/813,663

(22) PCT Filed: Aug. 2, 2011

(86) PCT No.: PCT/JP2011/067670
§ 371 (c)(1),
(2), (4) Date: Feb. 1, 2013

(87) PCT Pub. No.: WO2012/018010
PCT Pub. Date: Feb. 9, 2012

(65) Prior Publication Data
US 2013/0130499 A1 May 23, 2013

(30) Foreign Application Priority Data

Aug. 3, 2010 (JP) .................................. 2010-174514
Dec. 21, 2010 (JP) .................................. 2010-284461

(51) Int. Cl.
*B44C 1/22* (2006.01)
*H01L 21/302* (2006.01)
(Continued)

(52) U.S. Cl.
CPC ........ *H01L 21/302* (2013.01); *H01L 21/31116* (2013.01); *H01L 21/67069* (2013.01); *H01L 21/67201* (2013.01); *H01L 21/67745* (2013.01); *H01L 21/76224* (2013.01); *H01L 27/11521* (2013.01); *H01L 29/66825* (2013.01); *H01L 29/66833* (2013.01); *H01L 21/76283* (2013.01)

USPC ................. 216/58; 216/37; 216/67; 438/689; 438/692; 156/345.21

(58) Field of Classification Search
USPC ........................ 216/37, 58, 67; 438/689, 692; 156/345.21
See application file for complete search history.

(56) References Cited

U.S. PATENT DOCUMENTS

| 7,292,906 | B2  | 11/2007 | Funk et al. |
| 8,440,568 | B2* | 5/2013  | Ugajin .......................... 438/714 |
| 8,492,287 | B2* | 7/2013  | Tahara .......................... 438/714 |
| 2008/0223825 | A1 | 9/2008 | Onishi |
| 2009/0170321 | A1 | 7/2009 | Cho et al. |
| 2011/0035957 | A1 | 2/2011 | Muraki et al. |

FOREIGN PATENT DOCUMENTS

| JP | 2008 10619  | 1/2008 |
| JP | 2008 507131 | 3/2008 |

(Continued)

OTHER PUBLICATIONS

International Search Report Issued Nov. 8, 2011 in PCT/JP11/67670 Filed Aug. 2, 2011.

*Primary Examiner* — Lan Vinh
*Assistant Examiner* — Maki Angadi
(74) *Attorney, Agent, or Firm* — Oblon, Spivak, McClelland, Maier & Neustadt, L.L.P.

(57) ABSTRACT

A substrate processing method for removing an Si-based film on a surface of a substrate accommodated in a processing chamber includes a first step in which the Si-based film on the surface of the substrate is transformed into a reaction product by a gas containing a halogen element and an alkaline gas in the processing chamber and a second step in which the reaction product is vaporized in the processing chamber which is depressurized to a pressure lower than a pressure during the first step. The first step and the second step are repeated two or more times.

18 Claims, 11 Drawing Sheets

(51) Int. Cl.
 *H01L 21/311* (2006.01)
 *H01L 21/67* (2006.01)
 *H01L 21/677* (2006.01)
 *H01L 21/762* (2006.01)
 *H01L 27/115* (2006.01)
 *H01L 29/66* (2006.01)

(56) References Cited

FOREIGN PATENT DOCUMENTS

| | | |
|---|---|---|
| JP | 2008 160000 | 7/2008 |
| JP | 2008 235311 | 10/2008 |
| JP | 2009 164555 | 7/2009 |

* cited by examiner

FIG. 8

TABLE 1

| SEQUENCE | 1 | 2 | 3 | 4 | 5 | 6 | 7 | 8 | 9 | 10 |
|---|---|---|---|---|---|---|---|---|---|---|
| TIME | 1min | 30sec | 10sec | 1min | 10sec | 10sec | 1min | 10sec | 5sec | 1min |
| P(mT) | 2000 | 2000 | 900 | 900 | 0 | 900 | 900 | 0 | 0 | 0 |
| $N_2$ | 1000 | 500 | 0 | 0 | 0 | 0 | 0 | 0 | 0 | 0 |
| $NH_3$ | 0 | 0 | 80 | 80 | 0 | 80 | 80 | 0 | 80 | 0 |
| HF | 0 | 0 | 0 | 80 | 0 | 0 | 80 | 0 | 0 | 0 |
| Ar | 200 | 200 | 140 | 60 | 0 | 140 | 60 | 0 | 200 | 0 |

(SCCM)

TABLE 2

| SEQUENCE | 1 | 2 | 3 | 4 | 5 | 6 | 7 |
|---|---|---|---|---|---|---|---|
| TIME | 1min | 30sec | 10sec | 2min | 10sec | 5sec | 1min |
| P(mT) | 2000 | 2000 | 900 | 900 | 0 | 0 | 0 |
| $N_2$ | 1000 | 500 | 0 | 0 | 0 | 0 | 0 |
| $NH_3$ | 0 | 0 | 80 | 80 | 0 | 80 | 0 |
| HF | 0 | 0 | 0 | 80 | 0 | 0 | 0 |
| Ar | 200 | 200 | 140 | 60 | 0 | 200 | 0 |

(SCCM)

SUBSTRATE PROCESSING METHOD AND SUBSTRATE PROCESSING APPARATUS

FIELD OF THE INVENTION

The present invention relates to a substrate processing method and a substrate processing apparatus for removing an Si-based film on a substrate surface by chemical treatment and heat treatment.

BACKGROUND OF THE INVENTION

For example, in a manufacturing process of an NAND type flash memory, a process for removing an Si-based film such as a silicon oxide film ($SiO_2$ film) or a silicon nitride film (SiN film) which remains on a surface of a semiconductor wafer (hereinafter, referred to as "wafer") by etching is carried out. FIGS. 1 and 2 show parts of the manufacturing process of the NAND type flash memory. First, as shown in FIG. 1A, a silicon oxide film 101 is formed on a single crystalline silicon substrate 100 by thermal oxidation method and, then, a polysilicon film 102 is laminated thereon by an LPCVD method or the like. Next, as shown in FIG. 1B, parts of the polysilicon film 102, the silicon oxide film 101 and the single crystalline silicon substrate 100 are etched by consecutively performing a well-known anisotropic etching. As a consequence, grooves 105 are formed, and the devices are divided. Since each device is cut by the anisotropic etching, the silicon oxide film 101 serves as an insulating film 103 of each device, and the polysilicon film 102 serves as a floating gate 104 of each device. Further, the grooves 105 formed on the single crystalline silicon substrate 100 serve as shallow trench isolation (STI) regions.

As shown in FIG. 1C, a new silicon oxide film 106 is deposited so as to fill the grooves 105 and the spaces between the devices by an LPCVD method or the like. Next, the deposited silicon oxide film 106 is etched, the structure shown in FIG. 2A in which a partial sidewall 107 of a floating gate 104 is exposed is formed. Thereafter, as shown in FIG. 2B, an ONO insulating film 108 and a polysilicon film (control gate) 109 are laminated. Since the ONO insulating film 108 is laminated in a state where the partial sidewall 107 of the floating gate 104 is exposed, the contact area of the floating gate 104 and the ONO insulating film 108 is increased, and a write voltage applied to the control gate (the polysilicon film 109) in the case of writing data in a memory cell can be set to a low level. Here, as for the method for etching the silicon oxide film 106, wet etching using a liquid chemical, plasma etching using a reactive gas plasma or the like is conventionally known.

In the process for exposing the partial sidewall 107 of the floating gate 104 which is shown in FIG. 2A, the etching amount of the newly deposited silicon oxide film 106 determines a height of the exposed partial sidewall 107 of the floating gate 104, so that the etching amount needs to be controlled with high accuracy. If the etching amount of the silicon oxide film 106 is different from a design value in each device, the contact area of the floating gate 104 and the ONO insulating film 108 is changed. As a result, the reliability of the device deteriorates.

However, the wet etching has low controllability due to a high etching rate. Further, the plasma etching is disadvantageous in that it affects a film other than the Si-based film. Therefore, as for the method for selectively removing an Si-based film on a wafer surface with high accuracy, there is known a chemical removing process for chemically removing the Si-based film (see Patent Documents 1 and 2). In the chemical removing process, the Si-based film is transformed into a reaction product mainly made of ammonium fluorosilicate by supplying a gaseous mixture of a gas containing a halogen element and an alkaline gas into the processing chamber, and the reaction product is removed from the wafer by vaporizing (sublimating) the corresponding reaction product. In that case, hydrogen fluoride gas (HF) is used for the gas containing a halogen element, and ammonia gas ($NH_3$) is used for the alkaline gas, for example.

Patent Document 1: Japanese Patent Application Publication No. 2008-160000
Patent Document 2: Japanese Patent Application Publication No. 2008-235311

The chemical removing process has high controllability since it has a lower removal rate compared to the wet processing. Moreover, the chemical removing process is advantageous in that it causes less effect on a film other than the Si-based film compared to the plasma etching process. On the contrary, the chemical removing process has a low removal rate for the Si-based film and hardly increases productivity.

Meanwhile, as for an apparatus for performing a COR (Chemical Oxide Removal) process for chemically removing an oxide, there is conventionally known an apparatus including a chemical processing chamber for performing a process for transforming an oxide film on a surface of a wafer into a reaction product at a comparatively low temperature and a thermal processing chamber for performing a process for removing the reaction product from the wafer by heating and sublimation at a comparatively high temperature, as described in Patent Document 1. However, the processing apparatus in which the chemical processing chamber and the thermal processing chamber are separately provided is scaled up since the number of the processing chambers is increased. Moreover, if the chemical processing chamber and the thermal processing chamber are separately provided, a transfer device for transferring a substrate therebetween is required and, also, transfer time is required.

Meanwhile, there is suggested a substrate processing apparatus for performing a process for transforming an oxide film on a wafer surface into a reaction product at a low temperature and then performing a process for removing the reaction product from the wafer by heating and sublimation in the same processing chamber, as described in Patent Document 2. However, even in the same processing chamber, a long period of time is required to change the temperature of the wafer, and it is difficult to increase the productivity.

SUMMARY OF THE INVENTION

In view of the above, the present invention has a purpose of effectively removing an Si-based film by a chemical removing process.

In accordance with one aspect of the present invention, there is provided a substrate processing method for removing an Si-based film on a surface of a substrate accommodated in a processing chamber, the method including: a first step in which the Si-based film on the surface of the substrate is transformed into a reaction product by a gas containing a halogen element and an alkaline gas in the processing chamber; and a second step in which the reaction product is vaporized in the processing chamber which is depressurized to a pressure lower than a pressure during the first step, wherein the first step and the second step are repeated two or more times.

In accordance with another aspect of the present invention, there is provided a substrate processing apparatus for removing an Si-based film on a surface of a substrate accommodated in a processing chamber, including: a gas supply unit configured to supply a gas containing a halogen element and an alkaline gas into the processing chamber; a temperature control member configured to control a temperature of the substrate accommodated in the processing chamber; a gas exhaust unit configured to exhaust the processing chamber; and a control unit configured to control the gas supply unit, the temperature control member, and the gas exhaust unit, wherein a first step in which the Si-based film on the surface of the substrate is transformed into a reaction product by the gas containing a halogen element and the alkaline gas in the processing chamber and a second step in which the reaction product is sublimated in the processing chamber which is depressurized to a pressure lower than a pressure during the first step are performed by control of the control unit, and wherein the first step and the second step are repeated two or more times.

Effect of the Invention

In accordance with the present invention, the first step of transforming the Si-based film on the surface of the substrate into a reaction product by a gas containing a halogen element and an alkaline gas and the second step of sublimating the reaction product are repeated two or more times in the depressurized processing chamber. Accordingly, the removal rate for the Si-base film is increased, and the productivity is improved. Since the Si-based film on the surface of the substrate can be removed in the same processing chamber, it is possible to scale down the substrate processing apparatus, reduce the processing time and improve the throughput. Further, the chemical removing process has high controllability and causes less effect on a film other than the Si-based film, so that the Si-based film on the surface of the substrate can be selectively removed with high accuracy.

BRIEF DESCRIPTION OF THE DRAWINGS

FIGS. 1A to 1C explain a part of an NAND type flash memory manufacturing process, wherein FIG. 1A shows a state in which a silicon oxide film and a polysilicon film are laminated on a single crystalline silicon substrate; FIG. 1B shows a state in which the devices are divided; and FIG. 1C shows a state in which a silicon oxide film is deposited.

FIGS. 2A and 2B explain a process for exposing a sidewall of a floating gate, wherein FIG. 2A shows a state in which a part of a sidewall of a floating gate is exposed by etching a silicon oxide film; and FIG. 2B shows a state in which an ONO insulating film and a polysilicon film (control gate) are laminated.

FIG. 8 is a Table 1 showing a sequence of a COR process of an example of the present invention.

DETAILED DESCRIPTION OF THE EMBODIMENTS

Figure 1A:
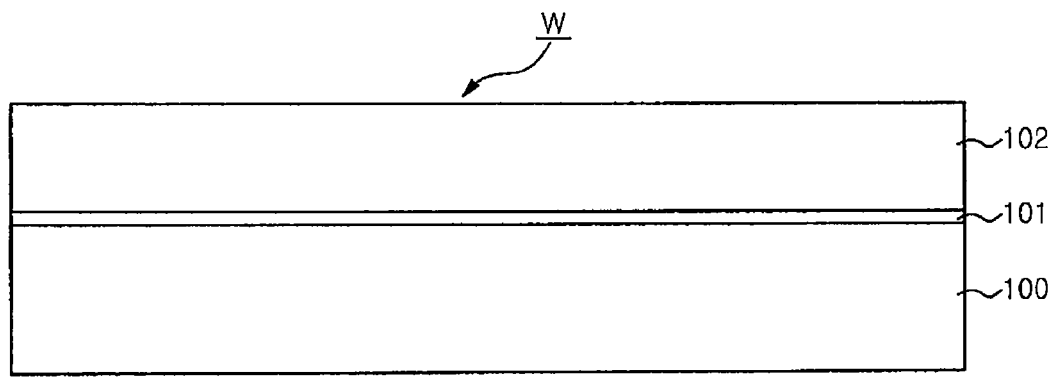
Figure 1B:
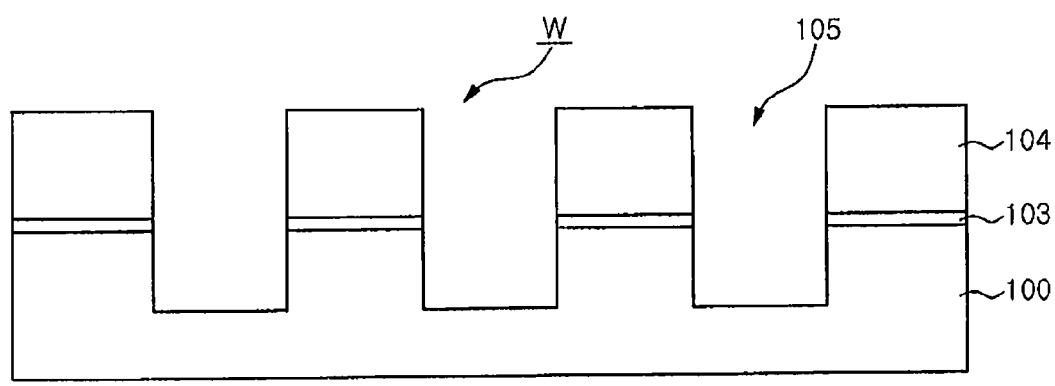

Hereinafter, the case of removing an oxide film ($SiO_2$) formed on a surface of a silicon wafer (hereinafter, referred to as "wafer") W by a COR (chemical oxide removal) process will be described as an example of a method and an apparatus for removing an Si-based film on a surface of a substrate in accordance with an embodiment of the present invention. In the present specification and the drawings, like elements having substantially the same functions denote like reference numerals, and redundant description thereof will be omitted.

Figure 3:
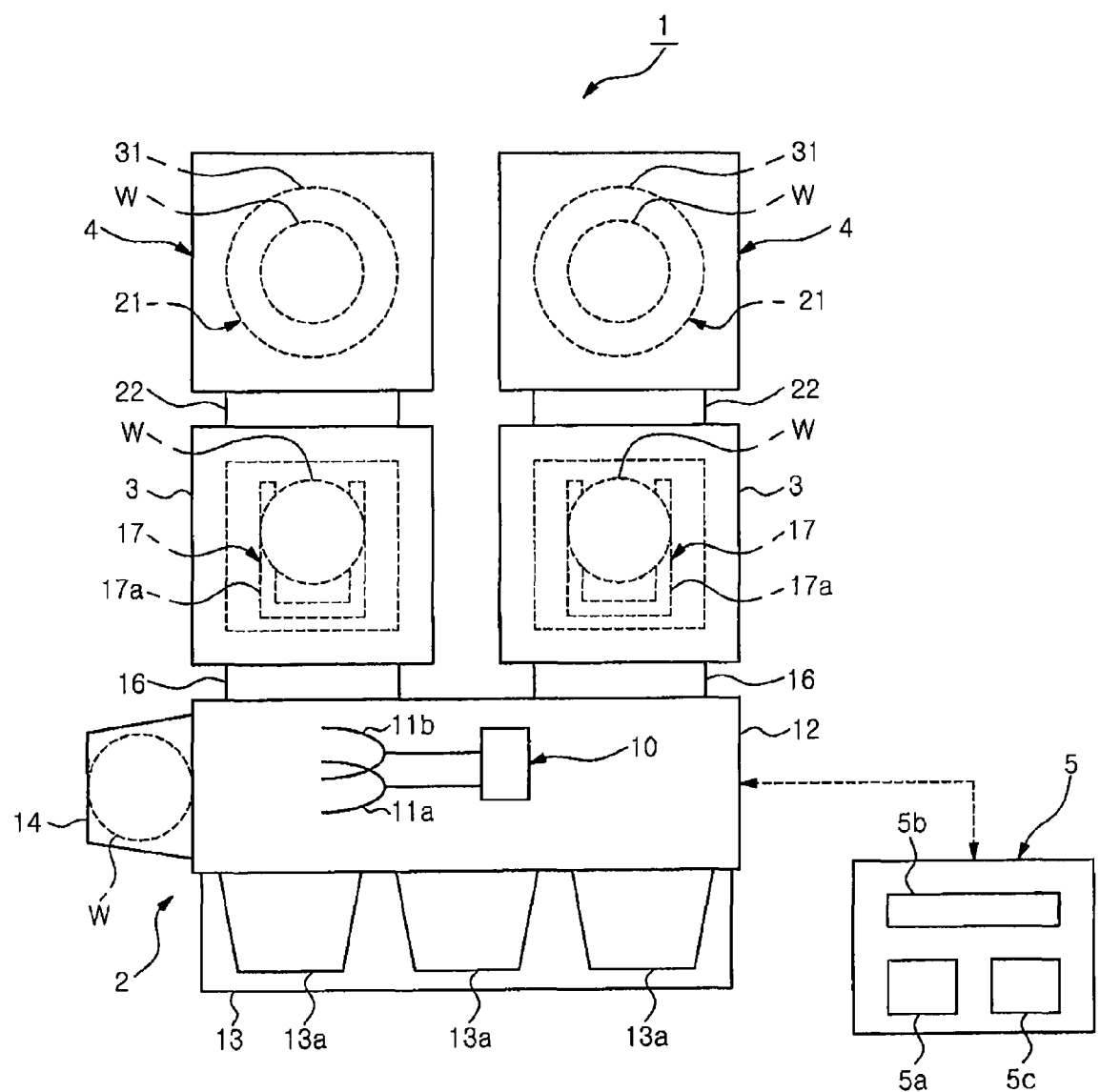
FIG. 3 is a top view showing a schematic configuration of a processing system.

As shown in FIG. 3, a processing system 1 includes: a loading/unloading port 2 for loading and unloading the wafer W into and from the processing system 1; two load-lock chambers disposed near the loading/unloading port 2; a COR processing apparatus 4, disposed adjacent to each load-lock chamber 3, serving as a substrate processing apparatus for removing an oxide film formed on a surface of the wafer W by a COR process; and a control unit 5 for sending control instructions to each unit of the processing system 1.

The loading/unloading port 2 includes a transfer chamber 12 having therein a first wafer transfer unit 10 for transferring, e.g., an approximately disc-shaped wafer W. The wafer transfer unit 10 has two transfer arms 11a and 11b for substantially horizontally maintaining the wafer. For example, a plurality of, e.g., three, mounting tables 13 for mounting thereon a carrier 13a capable of accommodating a plurality of the wafers W in parallel is provided at a side portion of the transfer chamber 12. Further, an orienter 14 for optically calculating an eccentricity of the wafer W while rotating the wafer W and orienting the wafer W is installed.

In the loading/unloading port 2, the wafer W is held by the transfer arms 11a and 11b and transferred to a desired location while rotated and moved back and forth in a substantially horizontal plane and moved up and down by the operation of the wafer transfer unit 10. Further, the wafer W is loaded into and unloaded from the carrier 13a on the mounting table 13, the orienter 14, and the load-lock chamber 3 by moving back and forth the transfer arms 11a and 11b.

Each of the load-lock chambers 3 is connected to the transfer chamber 12 via a gate valve 16 disposed therebetween. Each load-lock chamber 3 has therein a second wafer transfer unit 17 for transferring the wafer W. The wafer transfer unit 17 has a transfer arm 17a for substantially horizontally holding the wafer W. Moreover, the load-lock chambers 3 can be evacuated to vacuum.

In the load-lock chamber 3, the wafer W is held by the transfer arm 17a and transferred while being rotated and moved back and forth in a substantially horizontal plane and moved up and down by the wafer transfer unit 17. Further, the wafer W is loaded into and unloaded from the COR processing apparatus 4 by moving back and forth the transfer arm 17a with respect to the COR processing apparatus 4 connected to the load-lock chamber 3 vertically.

The COR processing apparatus 4 has a sealed processing chamber (processing space) 21 for accommodating the wafer W. Further, a loading/unloading port 35 for loading and unloading the wafer W into and from the processing chamber 21 is provided, and a gate valve 22 for opening and closing the loading/unloading port 35 is provided between the load-lock chamber 3 and the COR processing apparatus 4. The processing chamber 21 is connected to the load-lock chamber 3 via the gate valve 22.

Figure 4:
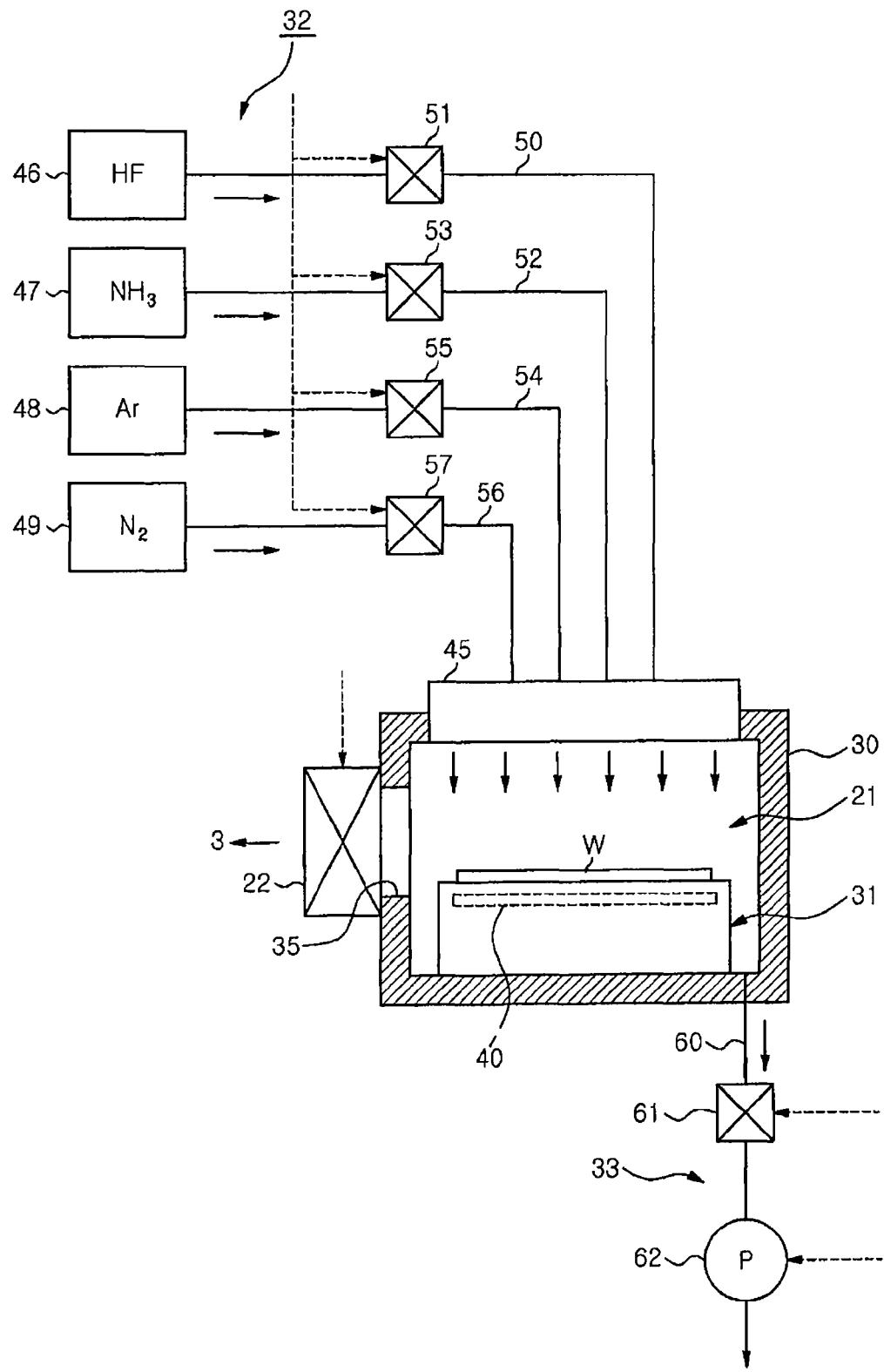
FIG. 4 explains a COR processing apparatus in accordance with an embodiment of the present invention.

As shown in FIG. 4, the COR processing apparatus 4 includes a sealed chamber 30 of which inner space serves as a processing chamber (processing space) 21 for accommodating the wafer W. The processing chamber 21 has therein a mounting table 31 for substantially horizontally mounting thereon the wafer W. Moreover, the COR processing apparatus 4 includes a gas supply unit 32 for supplying various gases into the processing chamber 21, and a gas exhaust unit 33 for exhausting and depressurizing the processing chamber 21.

The loading/unloading port 35 for loading and unloading the wafer W into and from the processing chamber 21 is provided at a sidewall of the chamber 30. The loading/unloading port 35 is open and closed by the gate valve 22 provided between the load-lock chamber 3 and the COR processing apparatus 4.

The mounting table 31 provided in the processing chamber 21 has an approximately cylindrical shape and is fixed to the bottom portion of the chamber 30. The mounting table 31 has therein a temperature control member 40 for controlling a temperature of the mounting table 31. The temperature control member 40 has a pipeline through which a temperature control liquid (e.g., water), for example, circulates. A temperature of a top surface of the mounting wafer W is controlled by heat exchange with the liquid circulating in the pipeline, and a temperature of the wafer W is controlled by heat exchange between the mounting table 31 and the wafer W mounted on the mounting table 31. The temperature control member 40 is not limited to the above, and may be an electric heater for heating the mounting table 31 and the wafer W by using, e.g., resistance heat, or the like.

A shower head 45 having a plurality of injection openings for injecting various gases into the processing chamber 21 is provided at a ceiling portion of the chamber 30. A gas supply unit 32 includes a hydrogen fluoride gas supply source 46, an ammonia gas supply source 47, an argon gas supply source 48, and a nitrogen gas supply source 49. The hydrogen fluoride gas supply source 46 and the shower head 45 are connected to each other via a hydrogen fluoride gas supply line 50. Attached to the hydrogen fluoride gas supply line 50 is a flow rate control valve 51 capable of controlling an opening/closing operation of the hydrogen fluoride gas supply line 50 and a supply flow rate of the hydrogen fluoride gas. The ammonia gas supply source 47 and the shower head 45 are connected to each other via an ammonia gas supply line 52. Attached to the ammonia gas supply line 52 is a flow rate control valve 53 capable of controlling an opening/closing operation of the ammonia gas supply line 52 and a supply flow rate of the ammonia gas. The argon gas supply source 48 and the shower head 45 are connected to each other via an argon gas supply line 54. Further, a volume control valve 55 capable of opening/closing operation for the argon gas supply line 52 and control for a supply flow rate of the argon gas is provided at the argon gas supply line 54. The nitrogen gas supply source 49 and the shower head 45 are connected to each other via a nitrogen gas supply line 56. Attached to the nitrogen gas supply line 56 is a flow rate control valve 57 capable of controlling an opening/closing operation of the nitrogen gas supply line 56 and a supply flow rate of the nitrogen gas.

A gas exhaust unit 33 has a gas exhaust line 60 connected to the bottom portion of the chamber 30. Attached to the gas exhaust line 60 are an opening/closing valve 61 and a gas exhaust pump 62 for forcibly exhausting the processing chamber 21.

The load-lock chamber 3, the wafer transfer unit 10, the orienter 14, the gate valves 16 and 22, the wafer transfer unit 17, the temperature control member 40 of the mounting table 31, the flow rate control valves 51, 53, 55 and 57 of the gas supply unit 32, and the opening/closing valve 61 and the gas exhaust pump 62 of the gas exhaust unit 33 which constitute the processing system 1 are controlled by the control unit 5. The control unit 5 is typically a general-purpose computer capable of performing any functions based on software.

As shown in FIG. 3, the control unit 5 includes: a calculation unit 5a having a CPU (central processing unit); an input/output unit 5b connected to the calculation unit 5a; and a storage medium 5c inserted to the input/output unit 5b, for storing control software. The storage medium 5c stores the control software (program) which is executed by the control unit 5 to control the processing system 1 to perform a predetermined substrate processing method to be described later. The control unit 5 controls functional elements of the processing system 1 to realize various processing conditions (e.g., a pressure in the processing chamber 21 and the like) defined by a predetermined process recipe by executing the control software. In other words, as will be described later in detail, the control unit 5 provides control commands for realizing each processing step in the COR processing apparatus 4.

The storage medium 5C may be fixedly provided in the control unit 5, or may be detachably set in a reader (not shown) provided in the control unit 5 and read out by the reader. In the most typical embodiment, the storage medium 5C is a hard disk drive in which the control software is installed by a service man of a manufacturer of the processing system 1. In another embodiment, the storage medium 5C is a removable disk such as a CD-ROM or a DVD-ROM with control software written therein.

Hereinafter, processing of the wafer W in the processing system 1 configured as described above will be explained. Further, the COR process in which a new silicon oxide film 106 deposited to fill the grooves 105 formed on a surface of the wafer W is removed by using a gaseous mixture of a hydrogen fluoride gas (HF) and an ammonia gas ($NH_3$) as described in FIG. 1C will be described as an example of the processing. The silicon oxide film 106 is embedded in the grooves 105 serving as device isolation regions (STI) and etched at a desired depth by the COR process to be described below, so that the partial sidewall 107 of the floating gate 104 is exposed.

Figure 1C:
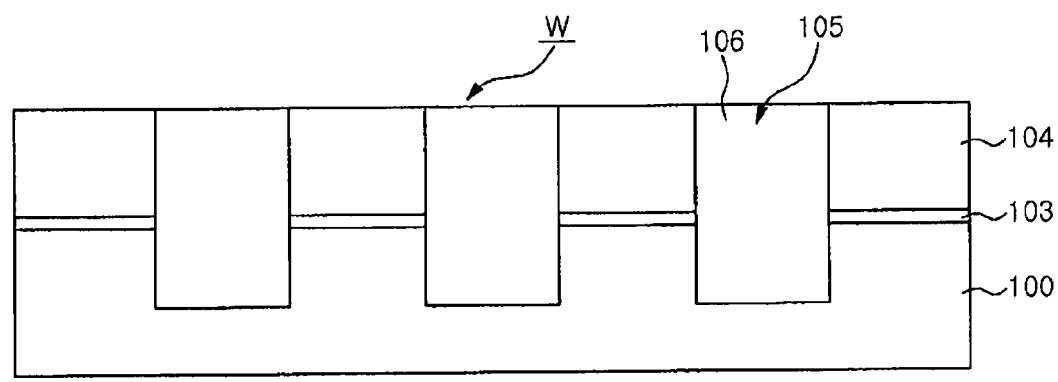
Figure 2A:
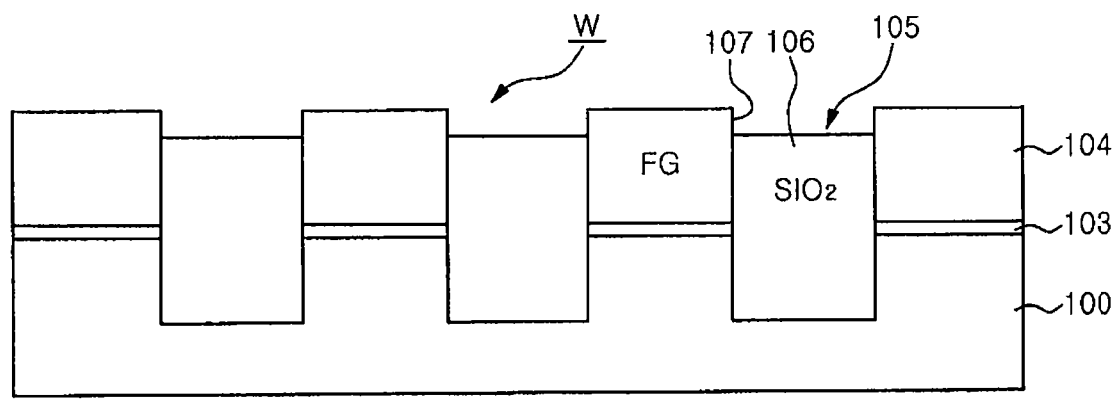
Figure 2B:
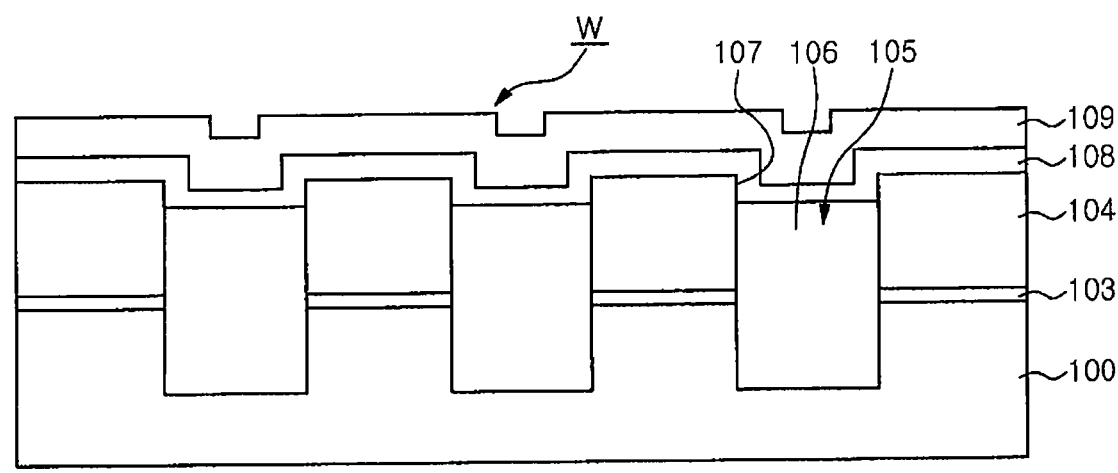

Before the wafer W is processed in the processing system 1, the top surface of the new silicon oxide film 106 embedded in the grooves 105 formed on the surface of the wafer W has the same height as that of the surface of the floating gate 104, as shown in FIG. 1C. For example, the chemical mechanical polishing (CMP) is performed after the deposition of the silicon oxide film 106, so that the top surface of the silicon oxide film 106 has the same height as that of the surface of the floating gate 104. Further, the wafer in which the top surface of the silicon oxide film 106 has the same height as that of the surface of the floating gate 14 is accommodated in the carrier 13a and transferred to the processing system 1. The silicon oxide films 106 embedded in the grooves 105 have the same height. Therefore, if the COR process is properly carried out, the partial sidewall 107 of the floating gate 104 exposed by the COR process has a uniform height in the wafer W.

In the processing system 1, the carrier 13a that accommodates a plurality of wafers W is mounted on the mounting table 13 as shown in FIG. 3. Then, a first wafer W is unloaded from the carrier 13a by the wafer transfer unit 10 and loaded into the load-lock chamber 3. After the first wafer W is loaded into the load-lock chamber 3, the load-lock chamber 3 is sealed and depressurized. Next, the gate valve 22 opens, and the load-lock chamber 3 communicates with the processing chamber 21 of the COR processing apparatus 4 which has been depressurized from the atmospheric pressure. The first wafer W is unloaded from the load-lock chamber 3 by the wafer transfer unit 17 and then loaded into the processing chamber 21 of the COR processing apparatus 4 after passing through the loading/unloading port 35.

In the processing chamber 31 of the COR processing apparatus 4, the wafer W is transferred from the transfer arm 106 of the wafer transfer unit 17 to the mounting table 31 in a state where a device formation surface thereof faces upward (the silicon oxide film 106 embedded in the grooves 105 faces upward). When the wafer W is loaded, the transfer arm 17a retreats from the processing chamber 21 and the gate valve 22 attached to the loading/unloading port 35 is closed to seal the processing chamber 21.

First, after the processing chamber 21 is sealed, the flow rate control valves 55 and 57 open and argon gas and nitrogen gas are supplied from the argon gas supply source 48 and the nitrogen gas supply source 49, respectively, into the processing chamber 21 for, e.g., about 1 minute 30 seconds. Further, the pressure in the processing chamber 21 is set to be lower than the atmospheric pressure by the operation of the gas exhaust pump 62.

In this case, the argon gas and the nitrogen gas are supplied into the processing chamber 21 at flow rates of, e.g., about 200 sccm and about 1000 sccm to 500 sccm, by the control of the flow rate control valves 55 and 57, respectively. Moreover, the pressure in the processing chamber 21 is reduced to, e.g., about 2000 mTorr. Meanwhile, the temperature of the wafer W on the mounting table 31 is controlled to a predetermined target temperature (about 90° C. or higher) by the temperature control unit 40.

After the temperature of the wafer W on the mounting table 31 is controlled to the predetermined target temperature (about 90° C. or higher), a removal step S for removing an Si-based film on the surface of the first wafer W is initiated. This removal step S includes a first step S1 of transforming the silicon oxide film 106 into a reaction product by supplying ammonia gas and hydrogen fluoride gas into the processing chamber 21 and a second step S2 of vaporizing the reaction product by decreasing the pressure in the processing chamber 21 to a level lower than that in the first step S1. In other words, ammonia gas is supplied from the ammonia gas supply source 47 into the processing chamber 21 for, e.g., 10 seconds. In this case, the ammonia gas is supplied into the processing chamber 21 at a flow rate of, e.g., about 80 sccm, by the control of the flow rate control valve 53. Further, argon gas is supplied into the processing chamber 21 at a flow rate of, e.g., about 140 sccm, by the control of the flow rate control valves 55 and 57. Moreover, the pressure in the processing chamber 21 is decreased to, e.g., about 900 mTorr, by the operation of the gas exhaust pump 62.

Next, hydrogen fluoride gas is supplied from the hydrogen fluoride gas supply source 46 into the processing chamber 21 while consecutively supplying ammonia gas from the ammonia gas supply source 47 to the processing chamber 21. Since the ammonia gas has been previously supplied into the processing chamber 21, an atmosphere in the processing chamber 21 is set to a processing atmosphere of a gaseous mixture containing the hydrogen fluoride gas and the ammonia gas by supplying the hydrogen fluoride gas. By supplying the gaseous mixture onto the surface of the wafer W in the processing chamber 21, the first step S1 in which the silicon oxide film 106 embedded in the grooves 105 on the surface of the wafer W is transformed into the reaction product is carried out. As for the reaction product, ammonium fluorosilicate, moisture or the like is generated.

In the first step S1, the hydrogen fluoride gas and the ammonium gas are supplied at flow rates of, e.g., about 80 sccm, are supplied into the processing chamber 21 by the control of the flow rate control valves 51 and 53, respectively. Further, argon gas is supplied into the processing chamber 21 at a flow rate of, e.g., about 60 sccm, and the supply of nitrogen gas is stopped by the control of the flow rate control valves 55 and 57. Moreover, the pressure in the processing chamber 21 is decreased to, e.g., about 900 mTorr, by the operation of the gas exhaust pump 62. Besides, the temperature of the wafer W on the mounting table 31 is maintained at the predetermined target temperature (about 90° C. or higher) by the temperature control member 40. Further, the first step S1 is performed for, e.g., about 1 minute.

Then, the second step S2 of vaporizing the silicon oxide film 106 that has been transformed into the reaction product in the first step S1 is carried out. In the second step S1, the silicon oxide film 106 that has been transformed into the reaction product is vaporized by decreasing the pressure in the processing chamber 21 to a level lower than that in the first step S1. In this case, the supply of the hydrogen fluoride gas, the ammonia gas, the argon gas, and the nitrogen gas into the processing chamber 21 is stopped by the control of the flow rate control valves 51, 53, 55 and 57. Further, the pressure in the processing chamber 21 is reduced to, e.g., about 0 mTorr, by the operation of the gas exhaust pump 62. Moreover, the temperature of the wafer W on the mounting table 31 is maintained at the predetermined target temperature (about 90° C.) by the temperature control member 40. The second step S2 is performed for, e.g., about 10 seconds.

However, the test performed by the inventors of the present invention showed that the speed of transformation from the silicon oxide film 106 into the reaction product decreased as time elapsed in the first step S1. It was also found that the amount of transformation into the reaction product became non-uniform in the surface of the wafer W as time elapsed. It is considered that this is because the reaction between the silicon oxide film 106 and the processing gases (the gaseous mixture containing hydrogen fluoride gas and ammonia gas) is disturbed by the growth of the reaction product. If the reaction product exists on the silicon oxide film 106, the possibility in which the silicon oxide film 106 and the reaction gas contact each other is changed in the surface of the wafer W. Since the removal amount of the silicon oxide film 106 determines the contact area of the floating gate and the ONO insulating film as described above, the removal amount of the silicon oxide film 106 needs to be highly uniform in the surface of the wafer W.

Here, the inventors of the present invention have conceived that the first step S1 is divided into a plurality of steps and the first step S1 performed for the second time and thereafter is executed after the reaction product is vaporized in the second step S2. Thus, the reaction product that has grown is vaporized before it affects the reaction between the silicon oxide film 106 and the processing gas. As a consequence, the first step S1 performed for the second time and thereafter can be initiated in a state where no reaction product exists on the silicon oxide film 106. Since there is no obstruction on the silicon oxide film 106, the reaction proceeds uniformly in the surface of the wafer W.

However, in accordance with the method in which the temperature of the substrate (wafer W) is increased as in the prior art, the substrate needs to be cooled to a predetermined temperature before the first step S2 performed for the second time and thereafter is executed. The process of cooling the heated substrate in the processing chamber remarkably deteriorates the speed of the entire processing. The present invention is characterized in that the first step S1 and the second step S2 are performed while changing the pressure in the processing chamber 21 without changing the temperature of the wafer W. In other words, the first step S1 and the second step S2 are performed in a state where the temperature of the wafer W is maintained at a predetermined target temperature (about 90° C. or higher), so that the cooling of the wafer W is not required even if the above steps are repeated multiple times. The wafer W is maintained at a temperature at which the reaction product is vaporized under the pressure in the second step S2. Meanwhile, the pressure in the processing chamber 21 in the first step S1 is maintained at a level at which the silicon oxide film 106 is transformed and the reaction product is deposited on the wafer W without being vaporized. Since it is unnecessary to provide a cooling member for absorbing heat of the wafer W in processing chamber 21, the adhesion of deposit to the inner wall of the processing chamber 21 can be prevented by setting the temperature of the entire inner wall of the processing chamber 21 to a level higher than or equal to a predetermined temperature.

As will be described in test examples to be given later, the case of executing the first step S1 for three minutes consecutively and then executing the second step S2 was compared with the case of repeating the process in which the second step S2 was executed whenever the first step S1 was executed for one minute three times. As a result, the following result was obtained. In other words, when the first step S1 was executed for three minutes consecutively and then the second step S2 was executed, the removal amount of the silicon oxide film 106 was about 17 nm. On the other hand, when the process in which the second step S2 was executed whenever the first step S1 was executed for one minute was repeated three times, the removal amount of the silicon oxide film 106 was about 30 nm.

Figure 5:
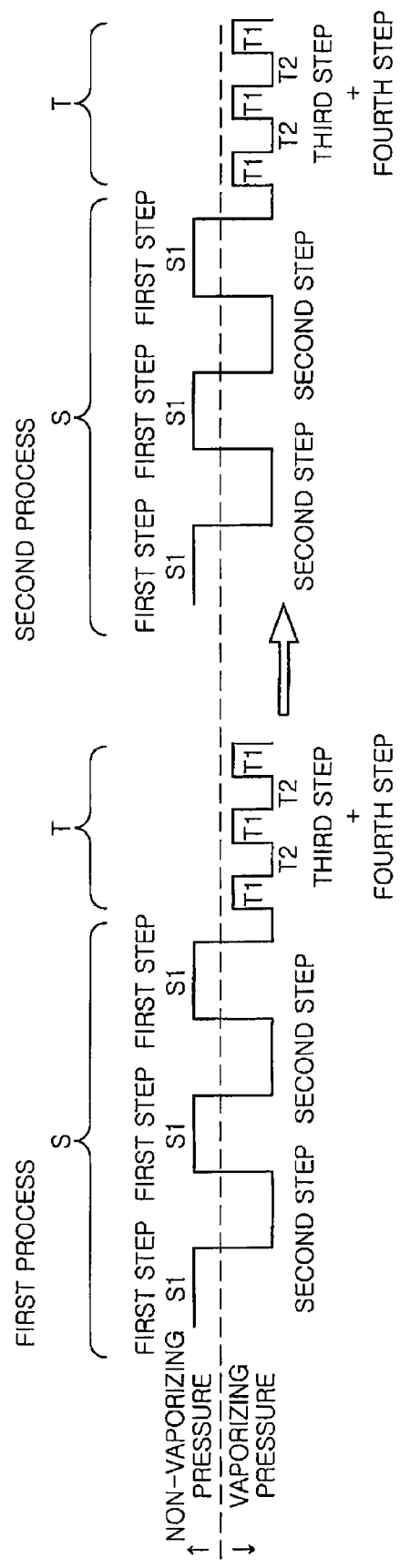
FIG. 5 explains processes of a wafer processing method.

Therefore, in the embodiment of the present invention, the first step S1 of transforming the silicon oxide film 106 into the reaction product and the second step S2 of vaporizing the silicon oxide film 106 that has been transformed into the reaction product are repeated two or more times to remove the silicon oxide film 106 embedded in the grooves 105 on the surface of the wafer W as shown in FIG. 5. In this case, the first step S1 is executed for about one minute and, then, the second step S2 is executed for about 10 seconds. Thereafter, the first step S1 is executed for about one minute and, then, the second step S2 is executed for about 10 seconds. While the first step S1 and the second step S2 are being repeatedly performed, the temperature of the wafer W on the mounting table 31 is maintained at a predetermined target temperature (about 90° C. or higher) by the temperature control unit 40.

In the removal step S, the silicon oxide film 106 embedded in the grooves 105 on the surface of the wafer W is removed to a desired depth by repeating the first step S1 and the second step S2 two or more times. Upon completion of the removal step S, a gas exhaust step T for forcibly exhausting gas in the processing chamber 21 is executed. In the gas exhaust step T, a third step T1 of supplying ammonia gas and hydrogen fluoride gas as an inert gas into the processing chamber 21 and a fourth step T2 of exhausting the processing chamber 21 are alternately executed two or more times.

In the third step T1, the supply of the hydrogen fluoride gas and the ammonia gas into the processing chamber 21 is stopped by the control of the flow rate control valves 51 and 53. Then, the inside of the processing chamber 21 is depressurized by the operation of the gas exhaust pump 62 and, at the same time, argon gas and nitrogen gas are supplied into the processing chamber 21 by the control of the flow rate control valves 55 and 57.

In the third step T1, the inside of the processing chamber 21 is depressurized by the gas exhaust pump 62 and, at the same time, argon gas and nitrogen gas are supplied at flow rates of, e.g., about 1000 sccm, by the control of the flow rate control valves 55 and 57, respectively. Accordingly, the pressure in the processing chamber 21 is increased to, e.g., a base pressure at the above flow rates. The third step T1 is executed for, e.g., about 3 seconds.

Upon completion of the third step T1, the fourth step T2 of exhausting the processing chamber 21 is executed. In the fourth step T2, the supply of the hydrogen fluoride gas, the ammonia gas, the argon gas and the nitrogen gas into the processing chamber 21 is stopped by the control of the flow rate control valves 51, 53, 55 and 57. Further, the pressure in the processing chamber 21 is decreased to, e.g., about 0 mTorr, by the operation of the gas exhaust pump. The step of exhausting the gas in the processing chamber 21 is executed for, e.g., about 5 seconds.

The third step T1 and the fourth step T2 are alternately executed two or more times. By alternately performing the third step T1 and the fourth step T2 two or more times, the gas exhaust step T of forcibly exhausting the processing chamber 21 is completed.

After the gas exhaust step T is completed, the gate valve 22 opens and the loading/unloading port 35 opens. The first wafer W is unloaded from the processing chamber 21 and returned to the load-lock chamber 3 by the wafer transfer unit 17. In this manner, a series of COR processes for the first wafer W is completed, and the first wafer W in which the silicon oxide film 106 embedded in the grooves 105 is removed to a desired depth is unloaded from the load-lock chamber 3 and returned to the carrier 13a by the wafer transfer unit 10.

Next, a second wafer W is unloaded from the carrier 13a and loaded into the load-lock chamber 3 by the wafer transfer unit 10. When the second wafer W is loaded into the load-lock chamber 3, the load-lock chamber 3 is sealed and depressurized. Then, the gate valve 22 opens and the load-lock chamber 3 communicates with the depressurized processing chamber 21 of the COR processing apparatus 4. The second wafer W is unloaded from the load-lock chamber 3 and loaded into the processing chamber 21 of the COR processing apparatus 4 after passing through the loading/unloading port 35.

Thereafter, by performing the steps described in FIG. 5, a series of COR processes for the second wafer W is completed, and the second wafer W in which the silicon oxide film 106 embedded in the grooves 105 is removed to a desired depth is unloaded from the load-lock chamber 3 and returned to the carrier 13a by the wafer transfer unit 10. Hereinafter, in the same manner, a series of COR processes are repeatedly performed for a plurality of wafers W in the same processing chamber 21.

With the processing system 1, the silicon oxide film 106 embedded in the grooves 105 on the surface of the wafer W can be removed to a desired depth and at a high etching rate by repeating two or more times the first step S1 of transforming the silicon oxide film 106 into the reaction product and the second step S2 of vaporizing the reaction product. Hence, the productivity is improved. Further, the silicon oxide film 106 embedded in the grooves 105 can be removed to a uniform depth. Since the silicon oxide film 106 is removed to a uniform depth, a write voltage in each device (NAND flash memory) isolated by the grooves 105 becomes uniform and reliability is improved. Moreover, since the first step S1 and the second step S2 are executed in the same processing chamber 21, the COR processing apparatus 4 and the processing system 1 are scaled down, and a footprint is decreased. In addition, processing time is shortened, and a throughput is improved. Further, the COR process has high controllability and causes less effect on a film other than the oxide film, so that the silicon oxide film 106 embedded in the grooves 105 can be selectively removed with high accuracy. Furthermore, by performing the first step S1 and the second step S2 at the same temperature, time required to change the temperature of the wafer W can be omitted, and the productivity is improved.

As in the processing method described with reference to FIG. 5, the reaction product (ammonium fluorosilicate, moisture or the like) generated by the COR process can be efficiently removed in a short period of time from the processing chamber 21 by repeating two or more times the third step T1 of supplying an inert gas into the processing chamber 21 and the fourth step T2 of exhausting the inside of the processing chamber 21 in the gas exhaust step T. In the third step T1 and the fourth step T2 of the gas exhaust step T, the pressure is changed within a range in which the reaction product can be vaporized, so that both of the vaporization of the reaction product on the wafer W and the effective exhaust of the processing chamber 21 can be realized at the same time. Since the gas exhaust step T has the same effect as that of the second step S2, it is possible to complete the removal step S in the first step S1 and continue the gas exhaust step T as shown in FIG. 5. Further, an additional process of exhausting the chamber is not necessary after the processed wafer W is unloaded, so that a next wafer W can be quickly processed. If a plurality of wafers W is processed in the same processing chamber 21, particles may remain in the processing chamber 21. However, in the present invention, the gas exhaust step T is executed whenever a single wafer W is processed. Therefore, such problem does not occur even if a plurality of wafers W is processed. By effectively removing the reaction product from the processing chamber 21, the generation of particles can be avoided. Further, since the gas exhaust step T is completed in a short period of time, the processing time is reduced and the productivity (throughput) is improved.

Moreover, when the first step S1 and the second step S2 are repeated two or more times, the vaporized reaction product is removed from the processing chamber 21 by depressurizing the processing chamber 21 in the second step S2 executed between the first steps S1. If the processing time of the second step S2 is insufficient, the reaction product is not completely vaporized and remains on the surface of the silicon oxide film 106. As a consequence, the amount of transformation of the silicon oxide film 106 into the reaction product in the following first step S1 is reduced. As a result, the etching amount is decreased.

Meanwhile, if the processing time of the second step S2 executed between the first steps S1 is excessive, a long period of time is required for the gaseous mixture containing hydrogen fluoride gas and ammonia gas to be adsorbed onto the silicon oxide film 106 in the following first step S1, which delays the start of the reaction. As a result, deviation occurs in the etching shape. In order to effectively and uniformly transform the silicon oxide film 106 into the reaction product, it is preferable to leave a small amount of the gaseous mixture containing hydrogen fluoride gas and ammonia gas in the processing chamber without completely removing the gaseous mixture containing hydrogen fluoride gas and ammonia gas from the processing chamber 21 in the second step S2 executed between the first steps S1.

If the gaseous mixture containing hydrogen fluoride gas and ammonia gas remains in the second step S2 executed between the first steps S1, the reaction product is easily deposited in the processing chamber 21, the gas exhaust line 60 or the like, which may cause particles. This problem becomes remarkable when the number of the processed wafers W is increased.

In accordance with the invention, the gaseous mixture or the reaction product remaining in the processing chamber 21 or the gas exhaust line 60 during the repetition of the first step S1 and the second step S2 can be effectively removed in a short period of time in the following gas exhaust step T. As a result, etching without deviation can be realized without decreasing the productivity (throughput). Therefore, the gas exhaust step T of the present invention is particularly useful in the case of repeating the first step S1 and the second step S2 two or more times.

When the first step S1 and the second step S2 are repeated two or more times, in the second step S2 executed between the first steps S1, it is preferable not to perform the third step T1 of supplying an inert gas into the processing chamber 21 which is performed in the gas exhaust step T. In other words, as described above, in order to effectively and uniformly transform the silicon oxide film 106 into the reaction product, it is preferable to complete the second step S2 executed between the first step S1 in a state where a small amount of gaseous mixture containing hydrogen fluoride gas and ammonia gas remains in the processing chamber 21. If the inert gas is supplied into the processing chamber 21 in the second step S2 executed between the first steps S1, the gaseous mixture containing hydrogen fluoride gas and ammonia gas is completely removed from the processing chamber 21, and deviation may occur in the etching shape. Thus, it is preferable to alternately perform the third step T1 and the fourth step T2 only in the gas exhaust step T executed upon completion of the final second step S2 without performing the third step T1 of supplying the inert gas into the processing chamber 21 in the second step S2 executed between the first steps S1.

In the present invention, the process of exposing the sidewall of the floating gate of the flash memory has been described as the test example. However, the present invention may also be applied to a process of manufacturing a FIN-type FET to be employed for a next generation device. A device film having a uniform height is made to protrude from the layer of the silicon oxide film. Along with the trend toward the miniaturization of the semiconductor, highly precise processes are more and more required for a device such as a transistor. The present invention enables precise etch-back of the silicon oxide film in a short period of time without damaging a device film such as polysilicon or the like. Hence, the technical significance thereof is extremely large.

Although the preferred embodiments of the present invention have been described, the present invention is not limited to the above examples. It will be understood by those skilled in the art that various changes and modification may be made without departing from the scope of the invention as defined in the following claims, and they are also included in the technical scope of the present invention. For example, the first step S1 and the second step S2 may be repeated two or more times, and the number of repetition may be any multiple number. Further, the third step T1 and the fourth step T2 may be repeated two or more times, and the number of repetition may be any multiple number. A gas supply step may be performed between T1 and T2.

Types of gases to be supplied into the processing chamber 21 are not limited to the combination described in the above embodiment. For example, the inert gas supplied into the processing chamber 21 may be only argon gas. Further, the inert gas may be another inert gas, e.g., any one of He gas, Xe gas or the like. Or, a mixture of two or more gases selected from argon gas, $N_2$ gas, He gas and Xe gas may also be used.

The configuration of the processing system 1 is not limited to that described in the above embodiment. For example, a processing system having a film forming apparatus may be used instead of the COR processing apparatus 4. Further, the structure of the substrate which is processed by the processing system 1 is not limited to that described in the above embodiment. Moreover, the removal of the oxide film which is performed by the processing system 1 is not limited to that of the silicon oxide film 106 embedded in the grooves 100 which is described in the above embodiment, and the present invention may be applied to various Si-based film removal methods.

The silicon oxide film as a removal target in the processing system 1 may be various silicon oxide films, e.g., a natural oxide film, a BPSG film, a HDP-$SiO_2$ film and the like. In that case, a depth at which the reaction product is saturated, an etching amount or the like can be controlled by controlling a temperature of the wafer W, a partial pressure of hydrogen fluoride gas in the gaseous mixture or the like in the COR process depending on types of the silicon oxide film. Further, the present invention is not limited to the COR process, and may also be applied to a chemical removal process for removing an SiN film on a surface of a substrate by supplying a gaseous mixture of a gas containing a halogen element and an alkaline gas into the processing chamber.

TEST EXAMPLES

Test Example 1

Figure 6:
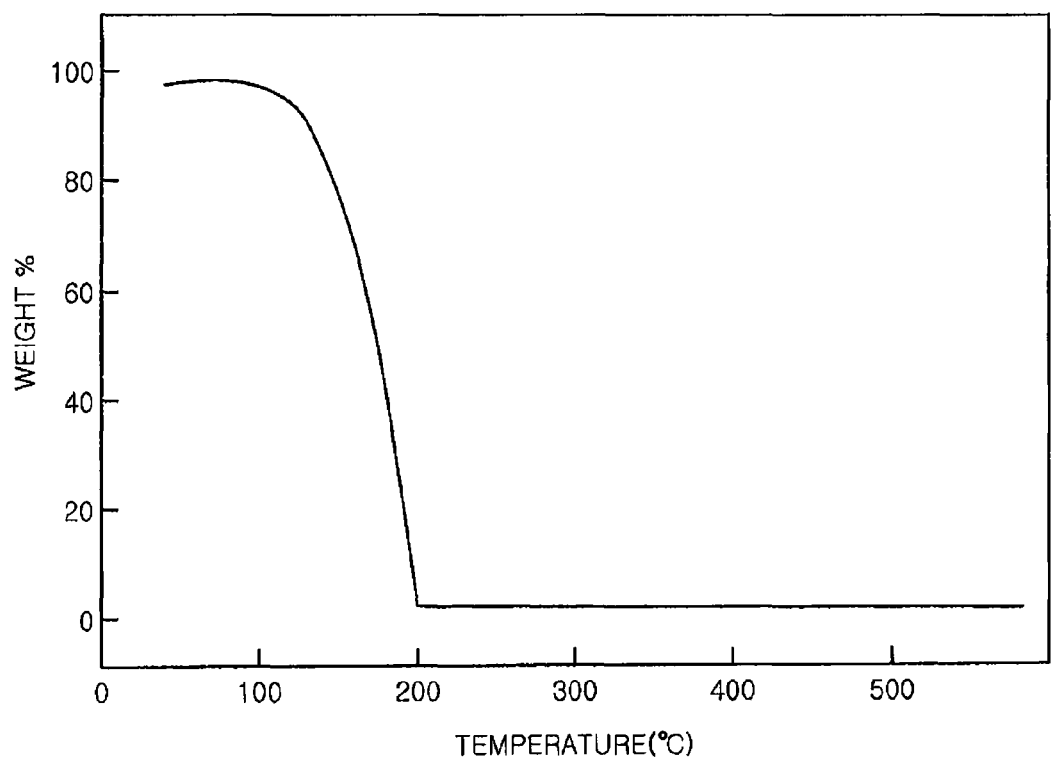
FIG. 6 is a graph showing a weight change of ammonium fluorosilicate in accordance with a temperature.

First, a sublimation temperature of ammonium fluorosilicate (($NH_4$)$2SiF_6$) as a reaction product generated from the silicon oxide film by the COR process was examined. The ammonium fluorosilicate was heated under the atmospheric pressure of $N_2$ environment, and the weight change was monitored. As a result, the result shown in FIG. 6 was obtained. It was seen that the ammonium fluorosilicate was sublimated when the temperature was higher than or about 90° C.

Figure 7:
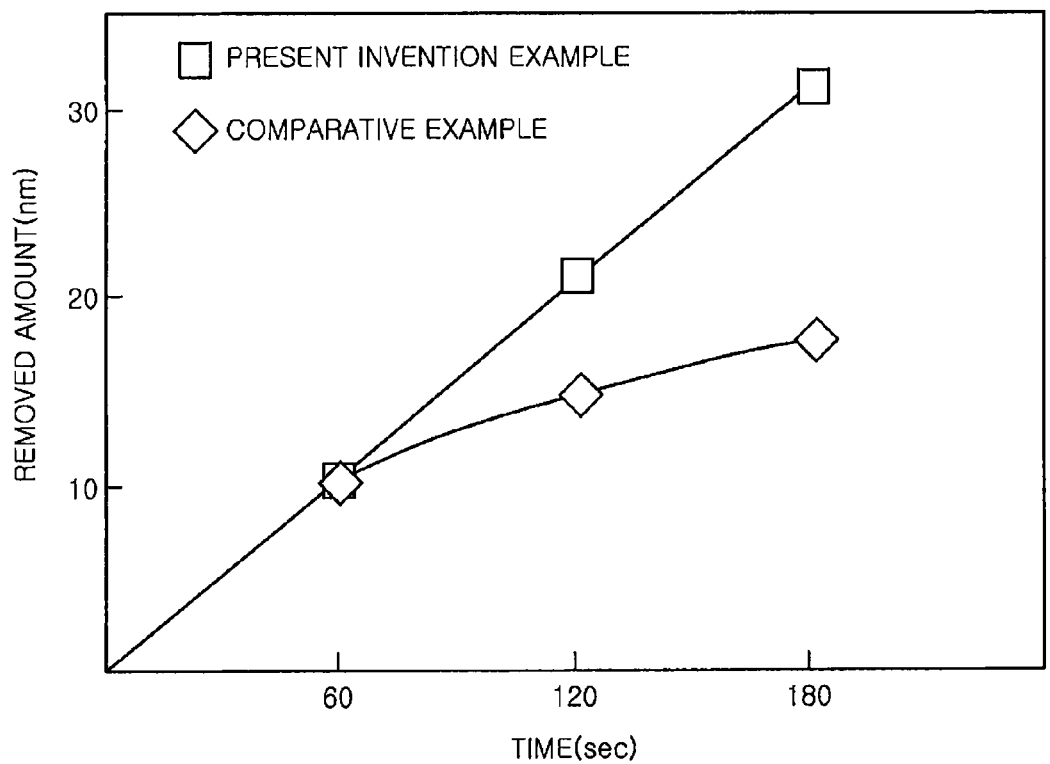
FIG. 7 is a graph showing changes in the removal amount of the silicon oxide film with respect to processing time in an example of the present invention (test example 1) in which a first step and a second step are repeated three times and in a comparative example in which a first step is consecutively performed and then a second step is performed.

Then, the effect obtained in the case of repeating the first step of transforming the silicon oxide film into the reaction product and the second step of sublimating the silicon oxide film that had been transformed into the reaction product in the first step was examined. The result thereof is shown in FIG. 7. In the example of the present invention, the first step of transforming the silicon oxide film into the reaction product was performed for about one minute; and the second step of sublimating the silicon oxide film that has been transformed into the reaction product in the first step was performed for about ten seconds; and then the first step (about one minute) and the second step (about ten seconds) were repeated three times. Meanwhile, in the comparative example, the first step of transforming the silicon oxide film into the reaction product was continuously performed for about three minutes and, then, the second step of sublimating the silicon oxide film that had been transformed into the reaction product in the first step was performed. Moreover, in both of the example of the present invention and the comparative example, the temperature of the wafer W was set to about 120° C. In the comparative example in which the first step was continuously performed for about three minutes, the transformation into the reaction product was saturated as time elapses and the transformation speed was decreased as time elapses. On the contrary, in the example of the present invention, the decrease in the transformation speed into the reaction product along with the lapse of time was not monitored.

Then, in the example of the present invention and the comparative example, the COR process was performed by using the wafer W in which the grooves 105 were filled with the silicon oxide films 106 as shown in FIG. 1C. In the example of the present invention, the COR process was performed in accordance with sequences 1 to 10 shown in FIG. 8 (Table 1). In the comparative example, the COR process was performed in accordance with sequences 1 to 7 shown in FIG. 9 (Table 2). In both of the example of the present invention and the comparative example, the temperature of the wafer W was set to about 120° C.

Figures 9, 10:
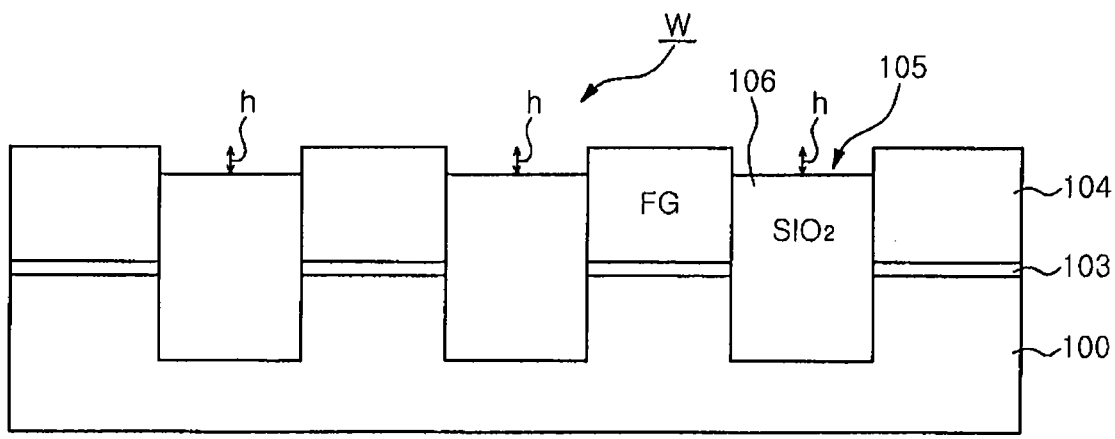
FIG. 9 is a Table 2 showing a sequence of a COR process of a comparative example.
FIG. 10 explains a state of a silicon oxide film removed by a COR process of a comparative example which is performed under the conditions shown in Table 1.
Figure 11:
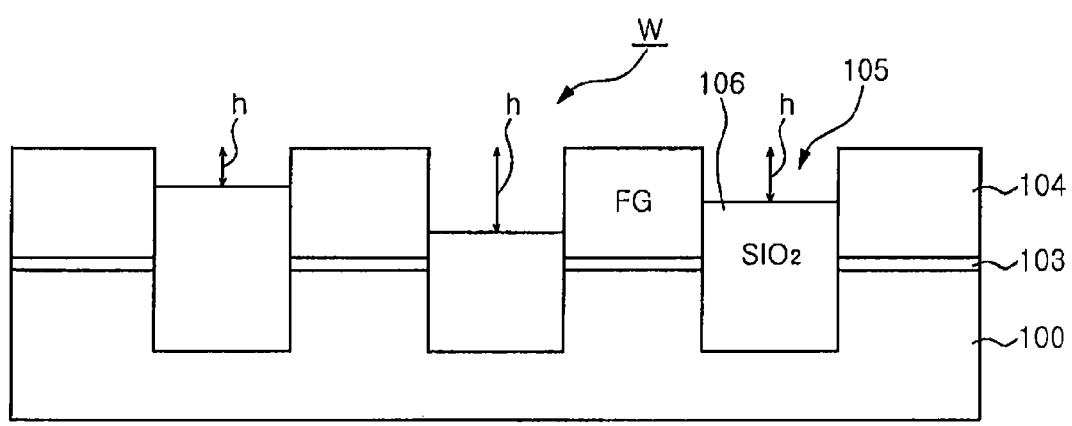
FIG. 11 explains a state of a silicon oxide film removed by a COR process of a comparative example which is performed under the conditions shown in Table 2.

As a result, in the example of the present invention in which the first step and the second step were repeated twice, the silicon oxide film 106 in the grooves 105 was uniformly removed at a depth h of about 80 nm, as shown in FIG. 10. On the other hand, in the comparative example in which the first step was consecutively performed for about 2 minutes and then the second step was performed, the removal depth h of the silicon oxide film 106 was non-uniform due to the grooves 106 and, also, the surface shape of the silicon oxide film 106 after the removal was not uniform, as shown in FIG. 11.

Test Examples 2 and 3

Next, the first step and the second step are alternately repeated seven times and then the gas in the processing chamber was forcibly exhausted by performing the gas exhaust step by using various methods. The result thereof is shown in FIG. 12.

Figure 12:
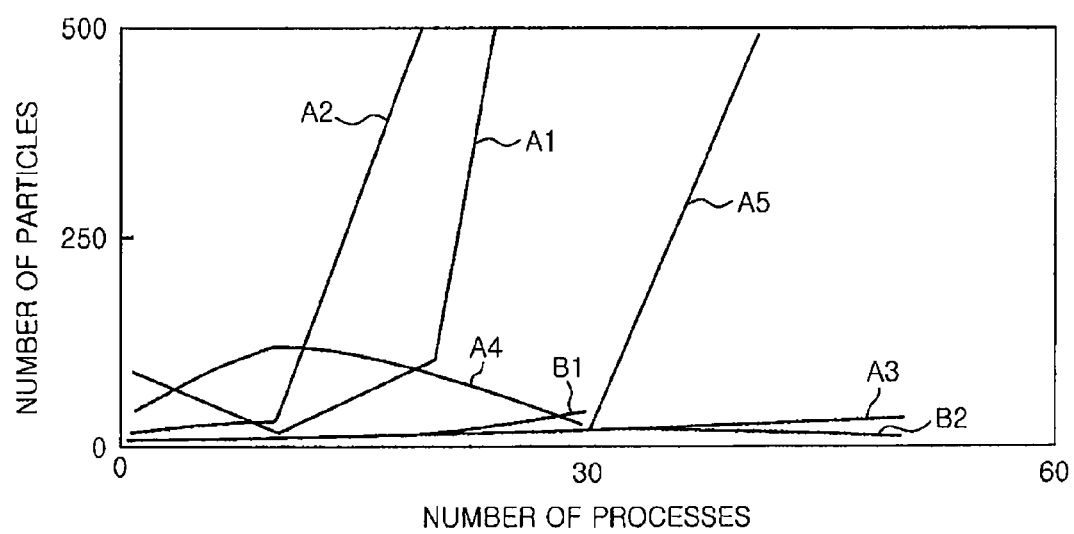
FIG. 12 is a graph for comparing gas exhaust steps of comparative examples 1 to 5 and test examples 2 and 3.

In FIG. 12, a horizontal axis represents the number of processed wafers, and a vertical axis represents the number of particles having a diameter of about 0.06 μm or above. Further, lines A1 to A5 (comparative examples 1 to 5) and lines B1 and B2 (test example 2 and 3) in FIG. 12 indicate the following conditions.

Comparative Example 1 (A1)

Whenever a single wafer was processed, the processing chamber was exhausted for about 30 seconds such that the pressure therein was decreased to about 0 mTorr.

Comparative Example 2 (A2)

Whenever five wafers were processed, a purge process was performed for about 30 seconds by supplying argon gas of about 1000 sccm and nitrogen gas of about 1000 sccm into the processing chamber.

Comparative Example 3 (A3)

Whenever a single wafer was processed, a purge process was performed for about five minutes by supplying argon gas of about 1000 sccm and nitrogen gas of about 1000 sccm into the processing chamber.

Comparative Example 4 (A4)

Whenever a single wafer was processed, argon gas of about 1000 sccm and nitrogen gas of about 1000 sccm were supplied into the processing chamber, and the processing chamber was exhausted for about 5 seconds such that the pressure therein was decreased to about 0 mTorr.

Comparative Example 5 (A5)

Whenever a single wafer was processed, argon gas of about 100 sccm and nitrogen gas of about 100 sccm were supplied into the processing chamber, and the processing chamber was exhausted for about 5 seconds such that the pressure therein was decreased to about 0 mTorr.

Test Example 2 (B1)

Whenever a single wafer was processed, the third step of supplying argon gas of about 1000 sccm and nitrogen gas of about 1000 sccm into processing chamber and maintaining a pressure in the processing chamber at about 0 mTorr for about 15 seconds and the fourth step of decreasing the pressure in the processing chamber 21 to about 0 mTorr for about 10 seconds were alternately repeated ten times.

Test Example 3 (B2)

Whenever a single wafer was processed, the third step of supplying argon gas of about 1000 sccm and nitrogen gas of about 1000 sccm into processing chamber and maintaining a pressure in the processing chamber at about 0 mTorr for about three seconds and the fourth step of decreasing the pressure in the processing chamber 21 to about 0 mTorr for five seconds were alternately repeated ten times.

In the comparative examples 1, 2, 4 and 5 (A1, A2, A4 and A5), particles were generated when the number of processes is increased. In the comparative example 3 (A3), the amount of particles was reduced. Since, however, five minutes were required for the gas exhaust step, the productivity (throughput) was decreased.

Meanwhile, in the test examples 2 and 3 of the present invention in which the third step and the fourth step are repeatedly performed, particles were not generated even if the number of processes is increased. Further, as in the test example 3, the processing time of the gas exhaust step can be reduced to about 80 seconds by repeatedly performing the third step for about 3 seconds and the fourth step for about 5 seconds ten times. Moreover, another test shows that generation of particles can be avoided by reducing the processing time of the gas exhaust step to about 30 seconds by performing the third step for 2 seconds and the fourth step for 3 seconds six times. According to the above results, in the present invention, both the prevention of generation of particles and the reduction of the processing time can be realized by alternately repeating the third step in which a nonreactive gas is supplied into the processing chamber and the fourth step in which the processing chamber is exhausted in the gas exhaust step.

INDUSTRIAL APPLICABILITY

The present invention may be applied to a technique for removing an Si-based film on a surface of a substrate by a chemical removing process.

DESCRIPTION OF REFERENCE NUMERALS

W wafer
1 processing system
2 loading/unloading port
3 load-lock chamber
4 COR processing apparatus
5 control unit
5a calculation unit
5b input/output unit
5c storage medium
10 first wafer transfer unit
12 transfer chamber
11a, 11b transfer arm
13 mounting table
13a carrier
14 orienter
16 gate valve
17 second transfer unit
17a transfer arm
21 processing chamber
30 chamber
31 mounting table
32 gas supply unit
33 gas exhaust unit
35 loading/unloading port
40 temperature control member
45 shower head
46 hydrogen fluoride gas supply source
47 ammonia gas supply source
48 argon gas supply source
49 nitrogen gas supply source
51, 53, 55, 57 flow rate control valve
60 gas exhaust line
61 opening/closing vale
62 gas exhaust pump
100 single crystalline silicon substrate
101 silicon oxide film
102 polysilicon film
103 gate insulating film
104 floating gate
105 groove
106 silicon oxide film
107 partial sidewall
108 ONO insulating film
109 polysilicon film (control gate)

What is claimed is:

1. A substrate processing method for removing an Si-based film on a surface of a substrate accommodated in a processing chamber, the method comprising:
a first step in which the Si-based film on the surface of the substrate is transformed into a reaction product by a gas containing a halogen element and an alkaline gas in the processing chamber; and
a second step following the first step in which the reaction product is vaporized in the processing chamber which is depressurized to a pressure lower than a pressure during the first step,
wherein the first step and the second step are sequentially repeated two or more times.

2. The substrate processing method of claim 1, wherein in the first and the second step, a temperature of the substrate becomes equal to or higher than a temperature at which the reaction product is sublimated.

3. The substrate processing method of claim 2, wherein in the first and the second step, the temperature of the substrate becomes equal to or higher than about 90° C.

4. The substrate processing method of claim 2, wherein in the first and the second step, the temperature of the substrate is not changed.

5. The substrate processing method of claim 1, wherein the removal of the Si-based film from the surface of the substrate results in an exposure of a sidewall of a film that is not transformed into the reaction product on the surface of the substrate.

6. The substrate processing method of claim 5, wherein the Si-based film is a silicon oxide film, and the film that is not transformed into the reaction product is a silicon film.

7. The substrate processing method of claim 1, further
a gas exhaust step in which the reaction product is exhausted from the processing chamber, the gas exhaust step being performed after performing the second step, and
wherein in the gas exhaust step, a third step in which a nonreactive gas is supplied into the processing chamber and a fourth step in which the processing chamber is exhausted while supplying no gas into the processing chamber.

8. The substrate processing method of claim 7, wherein in the third and the fourth step, a pressure in the processing chamber is set to a level at which the reaction products is sublimated.

9. The substrate processing method of claim 7, wherein the gas exhaust step is performed as a final step of the substrate processing method.

10. The substrate processing method of claim 7, wherein the gas exhaust step is repeated two or more times.

11. A substrate processing apparatus for performing a removal process of an Si-based film on a surface of a substrate accommodated in a processing chamber, comprising:
a gas supply unit configured to supply a gas containing a halogen element and an alkaline gas into the processing chamber;
a temperature control member configured to control a temperature of the substrate accommodated in the processing chamber;
a gas exhaust unit configured to exhaust the processing chamber; and
a control unit configured to control the gas supply unit, the temperature control member, and the gas exhaust unit to perform the removal process,
wherein the removal process in the control unit includes,
a first step in which the Si-based film on the surface of the substrate is transformed into a reaction product by the gas containing a halogen element and the alkaline gas in the processing chamber, and
a second step following the first step in which the reaction product is sublimated in the processing chamber which is depressurized to a pressure lower than a pressure during the first step, and
wherein the first step and the second step are sequentially repeated two or more times.

12. The substrate processing apparatus of claim 11, wherein in the first step and the second step, a temperature of the substrate becomes equal to or higher than a temperature at which the reaction product is sublimated.

13. The substrate processing apparatus of claim 12, wherein in the first step and the second step, a temperature of the substrate becomes equal to or higher than about 90° C.

14. The substrate processing apparatus of claim 12, wherein in the first step and the second step, a temperature of the substrate is not changed.

15. The substrate processing apparatus of claim 11,
wherein the control unit is further configured to control the gas supply unit, the temperature control member, and the gas exhaust unit to perform a gas exhaust step of exhausting the reaction product from the processing chamber, the gas exhaust step being performed after the removal process,
wherein in the gas exhaust step, a third step in which a nonreactive gas is supplied into the processing chamber and a fourth step in which the processing chamber is exhausted while supplying no gas into the processing chamber.

16. The substrate processing apparatus of claim 15, wherein in the third step and the fourth step, a pressure in the processing chamber becomes a level at which the reaction product is sublimated by the control of the control unit.

17. The substrate processing apparatus of claim 15, wherein the control unit is configured to perform the gas exhaust step as a final step of the removal process.

18. The substrate processing apparatus of claim 15, wherein the gas exhaust step is repeated two or more times.

* * * * *